(12) United States Patent
Chang et al.

(10) Patent No.: US 8,741,444 B2
(45) Date of Patent: Jun. 3, 2014

(54) PROCESS FOR SURFACE TREATING IRON-BASED ALLOY AND ARTICLE

(75) Inventors: Hsin-Pei Chang, New Taipei (TW);
Wen-Rong Chen, New Taipei (TW);
Huann-Wu Chiang, New Taipei (TW);
Cheng-Shi Chen, New Taipei (TW);
Ying-Ying Wang, Shenzhen (CN)

(73) Assignees: Hong Fu Jin Precision Industry (ShenZhen) Co., Ltd., Shenzhen (CN);
Hon Hai Precision Industry Co., Ltd., New Taipei (TW)

( * ) Notice: Subject to any disclaimer, the term of this patent is extended or adjusted under 35 U.S.C. 154(b) by 150 days.

(21) Appl. No.: 13/217,950

(22) Filed: Aug. 25, 2011

(65) Prior Publication Data
US 2012/0276408 A1    Nov. 1, 2012

(30) Foreign Application Priority Data
Apr. 27, 2011   (CN) .................. 2011 1 0106348

(51) Int. Cl.
*B32B 15/04*   (2006.01)
*C23C 14/14*   (2006.01)
*C23C 14/08*   (2006.01)
*C23C 14/35*   (2006.01)

(52) U.S. Cl.
USPC ................ 428/623; 428/472; 204/192.15

(58) Field of Classification Search
None
See application file for complete search history.

(56) References Cited

U.S. PATENT DOCUMENTS

| | | | |
|---|---|---|---|
| 5,843,369 A * | 12/1998 | Obara et al. | 420/34 |
| 6,136,456 A * | 10/2000 | Komatsubara et al. | 428/667 |
| 6,176,619 B1 * | 1/2001 | Nagasaka et al. | 384/123 |
| 2002/0119343 A1 * | 8/2002 | Betts | 428/651 |
| 2006/0152862 A1 * | 7/2006 | Nakatani et al. | 360/324.2 |

* cited by examiner

*Primary Examiner* — Vera Katz
(74) *Attorney, Agent, or Firm* — Novak Druce Connolly Bove + Quigg LLP

(57) ABSTRACT

A process for surface treating iron-based alloy includes providing a substrate made of iron-based alloy. A chromium layer is then formed on the substrate by vacuum sputtering. A silicon oxide layer, an alumina layer, and a boron nitride layer are formed in that order by vacuum evaporation.

8 Claims, 3 Drawing Sheets

PROCESS FOR SURFACE TREATING IRON-BASED ALLOY AND ARTICLE

CROSS-REFERENCE TO RELATED APPLICATIONS

This application is related to co-pending U.S. patent applications (Ser. No. 13/217,933 )and (Ser. No. 13/217,936), each entitled "PROCESS FOR SURFACE TREATING IRON-BASED ALLOY AND ARTICLE", each invented by Chang et al. These applications have the same assignee as the present application. The above-identified applications are incorporated herein by reference.

BACKGROUND

1. Technical Field

The disclosure generally relates to a process for surface treating iron-based alloy, and articles made of iron-based alloy treated by the process.

2. Description of Related Art

Articles made of iron-based alloy, such as die steel are often subjected to oxidation when used in high temperatures. Oxide films resulted from the oxidation can damage the quality of the surfaces of the articles. Furthermore, during repeated use, the oxide films can drop off, exposing an underneath iron-based alloy substrate. The exposed iron-based alloy substrate is further subjected to oxidation. Thus, the service life of the articles may be cut down.

Therefore, there is room for improvement within the art.

BRIEF DESCRIPTION OF THE FIGURES

Many aspects of the coated article can be better understood with reference to the following figures. The components in the figures are not necessarily drawn to scale, the emphasis instead being placed upon clearly illustrating the principles of the exemplary process for the surface treating of iron-based alloy and articles made of iron-based alloy treated by the process. Moreover, in the drawings like reference numerals designate corresponding parts throughout the several views. Wherever possible, the same reference numbers are used throughout the drawings to refer to the same or like elements of an embodiment.

DETAILED DESCRIPTION

Figure 1:
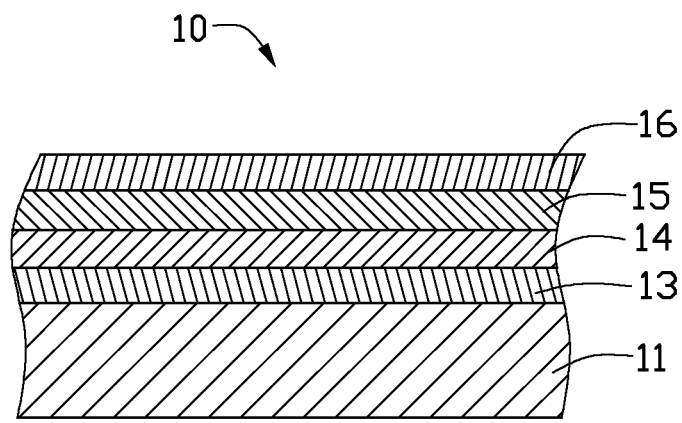
FIG. 1 is a cross-sectional view of an exemplary article treated in accordance with the present process.

An exemplary process for the surface treatment of iron-based ally may include the following steps:

Referring to FIG. 1, a substrate 11 is provided. The substrate 11 is made of an iron-based alloy, such as cutlery steel, die steel, gauge steel, or stainless steel containing chromium.

The substrate 11 is pretreated. The substrate 11 is cleaned with a solution (e.g., alcohol or acetone) in an ultrasonic cleaner, to remove impurities such as grease or dirt from the substrate 11. Then, the substrate 11 is dried.

Figure 2:
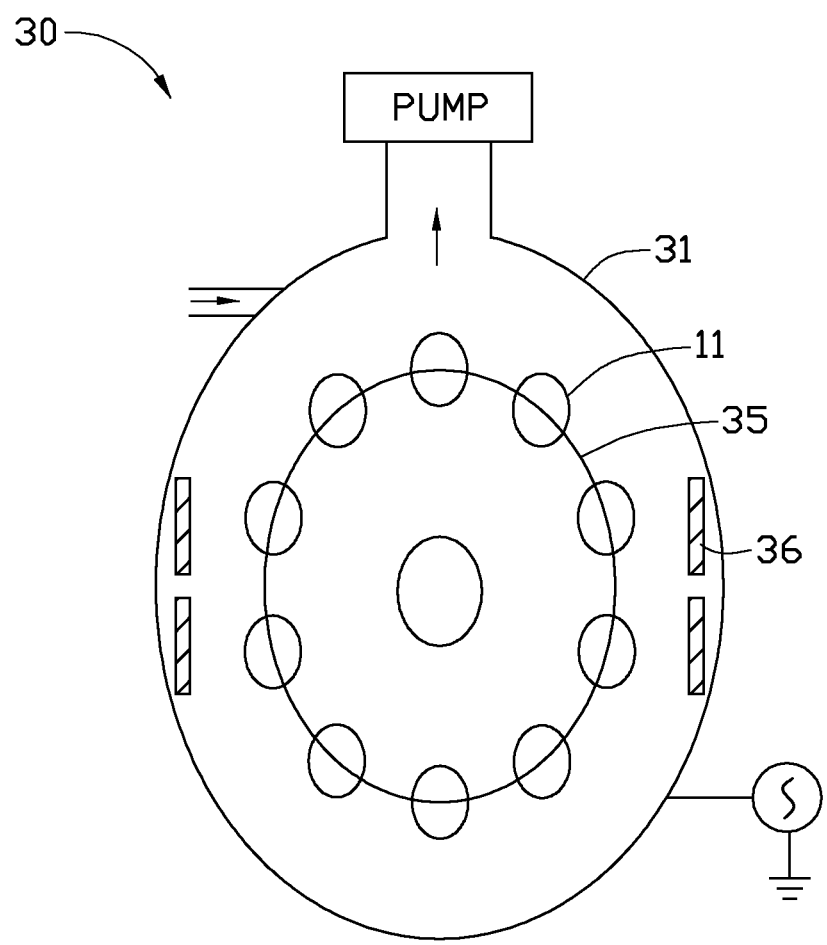
FIG. 2 is a schematic view of a vacuum sputtering machine for processing the exemplary article shown in FIG. 1.

The substrate 11 is plasma cleaned. Referring to FIG. 2, the substrate 11 may be held on a rotating bracket 35 in a vacuum chamber 31 of a vacuum sputtering machine 30. In this exemplary, the vacuum sputtering machine 30 is a DC magnetron sputtering machine. The vacuum chamber 31 is fixed with a chromium target 36 therein. The vacuum chamber 31 is then evacuated to a vacuum level of about $3\times10^{-5}$ torr-$5\times10^{-5}$ torr. Argon (Ar, having a purity of about 99.999%) is fed into the vacuum chamber 31 at a flow rate of about 100 standard-state cubic centimeters per minute (sccm) to 400 sccm. A bias voltage of about −200 V to about −300 V is applied to the substrate 11. Ar is ionized to plasma. The plasma then strikes the surface of the substrate 11 to clean the surface of the substrate 11 further. The plasma cleaning of the substrate 11 may take about 3 minutes (min) to about 20 min. The plasma cleaning process enhances the bond between the substrate 11 and a subsequently formed layer. The chromium target 36 is unaffected by the plasma cleaning process.

A chromium layer 13 is formed on the pretreated substrate 11 by vacuum sputtering. Sputtering of the chromium 13 is implemented in the vacuum chamber 31. The internal temperature of the vacuum chamber 31 may be controlled at about 20° C.-200° C. The flow rate of the argon is adjusted to about 100 sccm-300 sccm. The bias voltage applied to the substrate 11 is adjusted in a range between about −100 V and about −300 V. About 8 kW-12 kW of power is applied to the chromium target 36, depositing the chromium layer 13 on the substrate 11. The deposition of the chromium layer 13 may take about 5 min-20 min.

Figure 3:
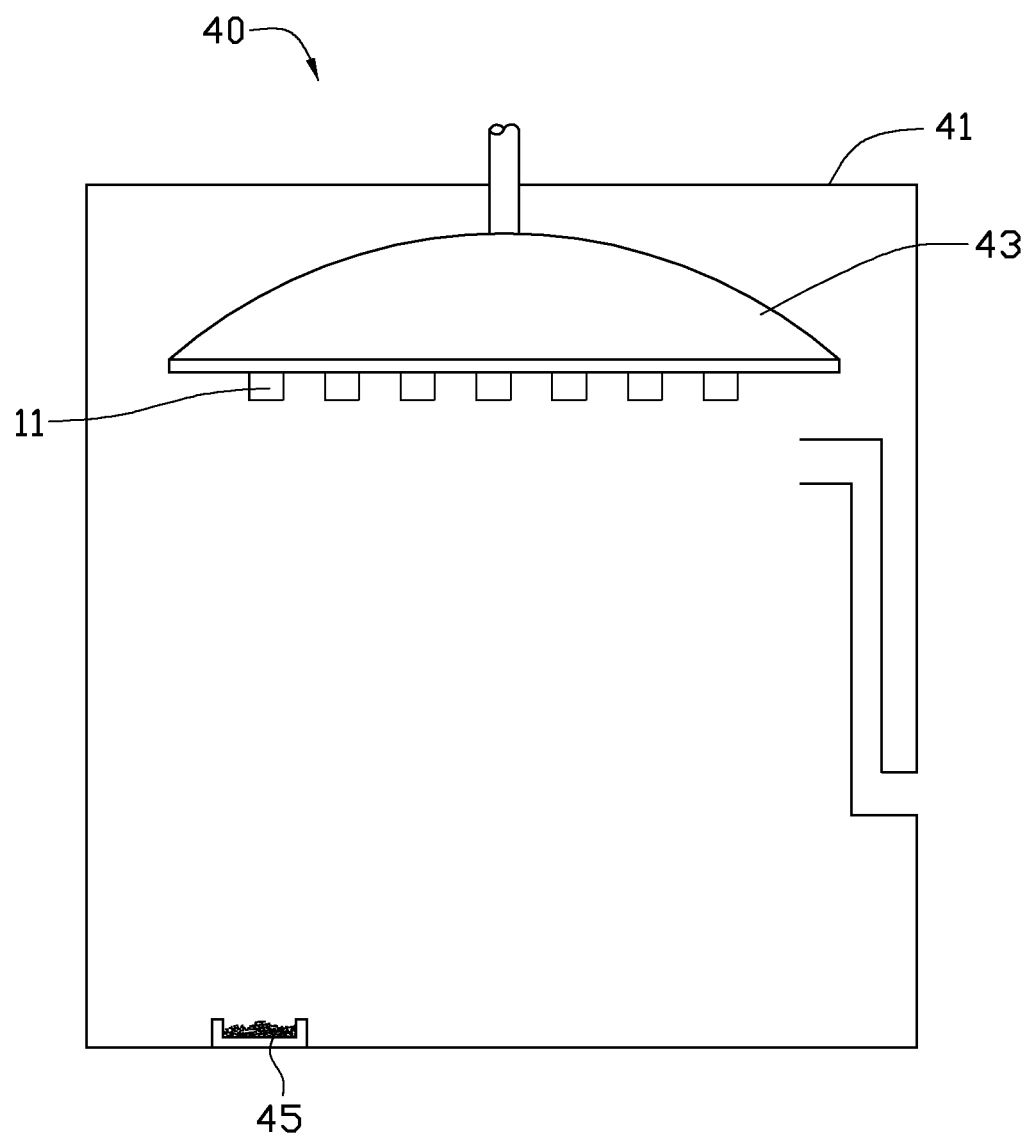
FIG. 3 is a schematic view of a vacuum evaporation machine for processing the exemplary article shown in FIG. 1.

A silicon oxide layer 14 is directly formed on the chromium layer 13 by vacuum evaporation. The substrate 11 with the chromium layer 13 may be held on a rotating supporter 43 in a plating chamber 41 of a vacuum evaporation machine 40 as shown in FIG. 3. The plating chamber 41 is set with evaporation material 45 therein. The plating chamber 41 is then evacuated to a vacuum level of about $4\times10^{-5}$ torr-$6\times10^{-5}$ torr and maintains the same vacuum level in the following steps. The internal temperature of the plating chamber 41 may be controlled at about 100° C.-200° C. Oxygen is fed into the plating chamber 41 at a flow rate of about 5 sccm-20 sccm. Silicon oxide is used as the evaporation material 45 for depositing the silicon oxide layer 14. An electron beam having a current of about 90 milliamperes (mA)-120 mA evaporates the silicon oxide, depositing the silicon oxide layer 14 on the chromium layer 13. The silicon oxide layer 14 may be deposited at a rate of about 5 nanometer per second (nm/s)-20 nm/s. The deposition of the silicon oxide layer 14 may take about 10 min-30 min. In this step, the oxygen is used to compensate for the oxygen atoms lost during the deposition, thereby ensuring the atomic ratio of silicon and oxygen within the silicon oxide layer 14 is substantially 1:2.

An alumina layer 15 is directly formed on the silicon oxide layer 14 by vacuum evaporation. Vacuum evaporation of the alumina layer 15 is implemented in the plating chamber 41. The internal temperature of the plating chamber 41 may be controlled at about 100° C.-200° C. Oxygen is fed into the plating chamber 41 at a flow rate of about 15 sccm-30 sccm. Alumina is used as the evaporation material 45 for depositing the alumina layer 15. An electron beam having a current of about 70 mA-100 mA evaporates the alumina, depositing the alumina layer 15 on the silicon oxide layer 14. The alumina layer 15 may be deposited at a rate of about 5 nm/s-20 nm/s. The deposition of the alumina layer 15 may take about 10 min-30 min. In this step, the oxygen is used to compensate for the oxygen atoms lost during the deposition, thereby ensuring the atomic ratio of aluminum and oxygen within the alumina layer 15 is substantially 2:3.

A boron nitride layer 16 is then directly formed on the alumina layer 15 by vacuum evaporation. Vacuum evaporation of the boron nitride layer 16 is implemented in the plating chamber 41. The internal temperature of the plating chamber 41 may be controlled at about 100° C.-200° C. Nitrogen is fed into the plating chamber 41 at a flow rate of about 15 sccm-30 sccm. Boron nitride is used as the evaporation material 45 for depositing the boron nitride layer 16. An electron beam having a current of about 60 mA-90 mA evaporates the boron nitride, depositing the boron nitride layer 16 on the alumina layer 15. The boron nitride layer 16 may be deposited at a rate of about 0.5 nm/s-2.5 nm/s. The deposition of the boron nitride layer 16 may take about 10 min-30 min In this step, the nitrogen is used to compensate for the nitrogen atoms lost during the deposition, thereby ensuring the atomic ratio of boron and nitrogen within the alumina layer 15 is substantially 1:1.

FIG. 1 shows a cross-section of an exemplary article 10 made of iron-based alloy and processed by the surface treatment process described above. The article 10 includes the substrate 11 having the chromium layer 13, the silicon oxide layer 14, the alumina layer 15, and the boron nitride layer 16 formed thereon, and in that order. The thickness of the chromium layer 13 may be about 20 nm-80 nm. The thickness of the silicon oxide layer 14 may be about 3 μm-10 μm. The thickness of the alumina layer 15 may be about 3 μm-5 μm. The thickness of the boron nitride layer 16 may be about 600 nm-3 μm.

The chromium layer 13, which is formed by vacuum sputtering, has a high bonding force with the substrate 11. The silicon oxide layer 14 and alumina layer 15 have a high density and a high melting point can prevent oxygen from entering the silicon oxide layer 14 and alumina layer 15, thus protecting the substrate 11 from oxidation. The boron nitride layer 16 has a good lubricity. Thus, when the article 10 used as a mold, the mold can be easily separated from molded articles.

EXAMPLES

Specific examples of the present disclosure are described as follows. The pretreatment in these specific examples may be substantially the same as described above so it is not described here again. The specific examples mainly emphasize the different process parameters of the process for the surface treatment of iron-based ally.

Example 1

The substrate 11 is made of a S316 type die steel. The vacuum chamber 31 of the vacuum sputtering machine 30 maintains a vacuum level of about $3\times10^{-5}$ torr. The plating chamber 41 of the vacuum evaporation machine 40 maintains a vacuum level of about $5\times10^{-5}$ torr.

Plasma cleaning the substrate 11: the flow rate of argon is 300 sccm; a bias voltage of −300 V is applied to the substrate 11; the plasma cleaning of the substrate 11 takes 5 min.

Sputtering to form chromium layer 13 on the substrate 11: the flow rate of argon is 150 sccm; the internal temperature of the vacuum chamber 31 is 30° C.; a bias voltage of −150 V is applied to the substrate 11; about 8 kW of power is applied to the chromium target 36; sputtering of the chromium layer 13 takes 6 min; the chromium layer 13 has a thickness of 25 nm.

Vacuum evaporation to form silicon oxide layer 14 on the chromium layer 13: the current of the electron beam is 90 mA; the flow rate of oxygen is 5 sccm; the internal temperature of the plating chamber 41 is 120° C.; the rate of depositing the silicon oxide layer 14 is 5 nm/s; deposition of the silicon oxide layer 14 takes 10 min; the silicon oxide layer 14 has a thickness of about 3 μm.

Vacuum evaporation to form alumina layer 15 on the silicon oxide layer 14: the current of the electron beam is 70 mA; the flow rate of oxygen is 15 sccm; the internal temperature of the plating chamber 41 is 120° C.; the rate of depositing the alumina layer 15 is 5 nm/s; deposition of the alumina layer 15 takes 10 min; the alumina layer 15 has a thickness of about 3 μm.

Vacuum evaporation to form boron nitride layer 16 on the alumina layer 15: the current of the electron beam is 65 mA; the flow rate of nitrogen is 16 sccm; the internal temperature of the plating chamber 41 is 180° C.; the rate of depositing the boron nitride layer 16 is 0.5 nm/s; deposition of the boron nitride layer 16 takes 20 min; the boron nitride layer 16 has a thickness of about 600 nm.

Example 2

The substrate 11 is made of a H11 type die steel. The vacuum chamber 31 of the vacuum sputtering machine 30 maintains a vacuum level of about $3\times10^{-5}$ torr. The plating chamber 41 of the vacuum evaporation machine 40 maintains a vacuum level of about $5\times10^{-5}$ torr.

Plasma cleaning the substrate 11: the flow rate of argon is 300 sccm; a bias voltage of −300 V is applied to the substrate 11; the plasma cleaning of the substrate 11 takes 5 min.

Sputtering to form chromium layer 13 on the substrate 11: the flow rate of argon is 150 sccm; the internal temperature of the vacuum chamber 31 is 120° C.; a bias voltage of −150 V is applied to the substrate 11; about 10 kW of power is applied to the chromium target 36; sputtering of the chromium layer 13 takes 10 min; the chromium layer 13 has a thickness of 50 nm.

Vacuum evaporation to form silicon oxide layer 14 on the chromium layer 13: the current of the electron beam is 110 mA; the flow rate of oxygen is 10 sccm; the internal temperature of the plating chamber 41 is 120° C.; the rate of depositing the silicon oxide layer 14 is 10 nm/s; deposition of the silicon oxide layer 14 takes 15 min; the silicon oxide layer 14 has a thickness of about 9 μm.

Vacuum evaporation to form alumina layer 15 on the silicon oxide layer 14: the current of the electron beam is 85 mA; the flow rate of oxygen is 20 sccm; the internal temperature of the plating chamber 41 is 120° C.; the rate of depositing the alumina layer 15 is 6 nm/s; deposition of the alumina layer 15 takes 12 min; the alumina layer 15 has a thickness of about 4.3 μm.

Vacuum evaporation to form boron nitride layer 16 on the alumina layer 15: the current of the electron beam is 80 mA; the flow rate of nitrogen is 25 sccm; the internal temperature of the plating chamber 41 is 180° C.; the rate of depositing the boron nitride layer 16 is 1.0 nm/s; deposition of the boron nitride layer 16 takes 30 min; the boron nitride layer 16 has a thickness of about 1.8 μm.

Example 3

The substrate 11 is made of a P20 type die steel. The vacuum chamber 31 of the vacuum sputtering machine 30 maintains a vacuum level of about $3\times10^{-5}$ torr. The plating chamber 41 of the vacuum evaporation machine 40 maintains a vacuum level of about $5\times10^{-5}$ torr.

Plasma cleaning the substrate 11: the flow rate of argon is 300 sccm; a bias voltage of −300 V is applied to the substrate 11; the plasma cleaning of the substrate 11 takes 5 min.

Sputtering to form chromium layer 13 on the substrate 11: the flow rate of argon is 150 sccm; the internal temperature of the vacuum chamber 31 is 120° C.; a bias voltage of −150 V is applied to the substrate 11; about 12 kW of power is applied to the chromium target 36; sputtering of the chromium layer 13 takes 15 min; the chromium layer 13 has a thickness of 78 nm.

Vacuum evaporation to form silicon oxide layer 14 on the chromium layer 13: the current of the electron beam is 118 mA; the flow rate of oxygen is 19 sccm; the internal temperature of the plating chamber 41 is 120° C.; the rate of depositing the silicon oxide layer 14 is 16 nm/s; deposition of the silicon oxide layer 14 takes 10 min; the silicon oxide layer 14 has a thickness of about 9.6 μm.

Vacuum evaporation to form alumina layer 15 on the silicon oxide layer 14: the current of the electron beam is 90 mA; the flow rate of oxygen is 20 sccm; the internal temperature of the plating chamber 41 is 120° C.; the rate of depositing the alumina layer 15 is 8 nm/s; deposition of the alumina layer 15 takes 10 min; the alumina layer 15 has a thickness of about 4.8 μm.

Vacuum evaporation to form boron nitride layer 16 on the alumina layer 15: the current of the electron beam is 80 mA; the flow rate of nitrogen is 25 sccm; the internal temperature of the plating chamber 41 is 180° C.; the rate of depositing the boron nitride layer 16 is 2 nm/s; deposition of the boron nitride layer 16 takes 15 min; the boron nitride layer 16 has a thickness of about 1.8 μm.

An oxidation test at high temperature was applied to the samples created by examples 1-3. The test was carried out in an air atmosphere. The samples were retained in a high temperature oven for about 1 hour and then were removed. The oven maintained an internal temperature of about 800° C. Neither oxidation no peeling was fund with the samples created by examples 1-3.

It is believed that the exemplary embodiment and its advantages will be understood from the foregoing description, and it will be apparent that various changes may be made thereto without departing from the spirit and scope of the disclosure or sacrificing all of its advantages, the examples hereinbefore described merely being preferred or exemplary embodiment of the disclosure.

What is claimed is:

1. An article, comprising:
    a substrate made of iron-based alloy;
    a chromium layer formed on the substrate;
    a silicon oxide layer consisting of silicon oxide formed on the chromium layer;
    an alumina layer formed on the silicon oxide layer; and
    a boron nitride layer formed on the alumina layer.

2. The article as claimed in claim 1, wherein the chromium layer has a thickness of about 20 nm-80 nm.

3. The article as claimed in claim 1, wherein the silicon oxide layer has a thickness of about 3 μm-10 μm.

4. The article as claimed in claim 1, wherein the alumina layer has a thickness of about 3 μm-5 μm.

5. The article as claimed in claim 1, wherein the boron nitride layer has a thickness of about 600 nm-3 μm.

6. The article as claimed in claim 1, wherein the chromium layer is formed by vacuum sputtering.

7. The article as claimed in claim 1, wherein the silicon oxide layer, alumina layer, and boron nitride layer are formed by vacuum evaporation.

8. The article as claimed in claim 1, wherein the substrate is made of a material selected from the group consisting of cutlery steel, die steel, gauge steel, and stainless steel containing chromium.

\* \* \* \* \*